United States Patent
Chen et al.

(10) Patent No.: US 7,576,418 B2
(45) Date of Patent: Aug. 18, 2009

(54) LEAD FRAME STRUCTURE AND APPLICATIONS THEREOF

(75) Inventors: Chia-Yu Chen, Kaohsiung (TW); Ta-Lin Pong, Kaohsiung (TW); En-Shou Chang, Budai Township, Chiayi County (TW); I-Chi Cheng, Kaohsiung (TW); Chen-Ping Su, Kaohsiung (TW)

(73) Assignee: Orient Semiconductor Electronics, Ltd., Kaohsiung (TW)

( * ) Notice: Subject to any disclaimer, the term of this patent is extended or adjusted under 35 U.S.C. 154(b) by 0 days.

(21) Appl. No.: 12/167,622

(22) Filed: Jul. 3, 2008

(65) Prior Publication Data
US 2009/0121329 A1    May 14, 2009

(30) Foreign Application Priority Data
Nov. 12, 2007   (TW) ............................... 96142746 A

(51) Int. Cl.
*H01L 23/495* (2006.01)
(52) U.S. Cl. ................. 257/670; 257/674; 257/696; 257/E23.037; 257/E23.042; 257/E23.046; 257/E23.05
(58) Field of Classification Search ......... 257/666–677, 257/E23.031–E23.059, E23.004, 696; 438/111, 438/112, 123, FOR. 368, FOR. 367, FOR. 377, 438/FOR. 380
See application file for complete search history.

(56) References Cited

U.S. PATENT DOCUMENTS

| | | | | |
|---|---|---|---|---|
| 5,430,250 A | * | 7/1995 | Kwon | 174/535 |
| 6,809,408 B2 | * | 10/2004 | Yu et al. | 257/676 |

* cited by examiner

*Primary Examiner*—Jasmine J Clark
(74) *Attorney, Agent, or Firm*—Muncy, Geissler, Olds & Lowe, PLLC

(57) ABSTRACT

A lead frame structure comprises a side rail, a first paddle, a second paddle, a plurality of leads, and an downset anchor bar. The first paddle is connected to the side rail via at least one first tie bar, and the second paddle is connected to the side rail via at least one-second tie bar. The first paddle and the second paddle separated from each other are used to define an area to support a chip. These leads set on the side rail expends toward to the chip supporting area. One end of the downset anchor bar is connected to the side rail, and the other end of the downset anchor bar has a protrusion portion which is between the first paddle and the second paddle and is downset from the side rail.

14 Claims, 4 Drawing Sheets

LEAD FRAME STRUCTURE AND APPLICATIONS THEREOF

RELATED APPLICATIONS

This application claims priority to Taiwan Application Serial Number 96142746, filed Nov. 12, 2007, which is herein incorporated by reference.

FIELD OF THE INVENTION

The present invention relates to a lead frame structure and the applications thereof, and more particularly relates to an lead frame structure with a plurality of separated chip paddles and the applications thereof.

BACKGROUND OF THE INVENTION

Chip packaging is one of the crucial processes in manufacturing a semiconductor device. The chip packaging process is started by the step of providing a lead frame structure with a chip carrier to support a semiconductor chip, wherein the chip carrier also severs as a bridge to electrically connect the semiconductor chip with other external electronic devices.

The semiconductor chip is first fixed on the carrier and then is electrically connected to the leads set on the lead frame structure by a welding step. Subsequently, a melted epoxy compound is then dispersed and molded to encapsulate the semiconductor die. The lead frame structure encapsulated by the molded epoxy compound is then trimmed to remove the spare materials (such as tie bars, a framework of the lead frame structured used to support the carrier, or the redundant molded epoxy compound) by a series punch steps, and the leads can be then bended into a predetermined shape.

However besides the physical nonconformity actually existed between the molded epoxy compound and the chip carrier, there are still problems to cause the molded epoxy compound and the chip carrier delaminated.

For example, since the melted epoxy compound is viscous, and the chip carrier could resist against the flow of the melted epoxy compound, when the greater carrier is applied, it is harder to disperse the epoxy compound uniformly to encapsulate semiconductor chip and the carrier. The molded epoxy compound cannot be integrated with the carrier well, and delaminating problems may occur.

To resolve the aforementioned problems, several penetrating openings are formed on the carrier to reduce the flowing resistance against the carrier, so as to enhance the dispersion of the melted epoxy compound. However applying the penetrating openings cannot thoroughly resolve the delaminating problems, but otherwise reduces the supporting force against the flowing epoxy molding compound and results in the carrier bended.

It is desirable to provide an improved lead frame structure with simple structure and less cost to resolve the lamination problems without reducing the supporting force against the flowing epoxy molding compound during the chip encapsulating steps.

SUMMARY OF THE INVENTION

An aspect of the present invention is to provide a lead frame structure with simple construction and reliable supporting force to save it's materials, and the simple structure of the lead frame structure can reduce the flow resistance of a meld epoxy compound against the lead frame during a semiconductor packaging process. The meld epoxy compound can be dispersed more uniformly to encapsulate the lead frame structure. So that the meld epoxy compound can be integrated with the lead frame structure well, and delaminating problems occur there between can be resolved.

The lead frame structure comprises a side rail, a first paddle, a second paddle, a lest one leads, and an downset anchor bar. The first paddle is connected to the side rail via at least one first tie bar, and the second paddle is connected to the side rail via at least one-second tie bar. The first paddle and the second paddle separated from each other are used to define an area to support a semiconductor chip. The lead set on the side rail expends toward to the chip supporting area. One end of the downset anchor bar is connected to the side rail, and the other end of the downset anchor bar has a protrusion portion which is between the first paddle and the second paddle and is downset from the side rail.

Another aspect of the present invention is to provide a semiconductor package structure with simple construction, less manufacturing costs and higher reliability. The semiconductor package structure comprises a first paddle, a second paddle, a semiconductor chip, at least one lead, a downset anchor bar and a molded compound. The first paddle and the second paddle separated from each other are used to define an area to support the semiconductor chip. The semiconductor chip is fixed on the supporting area. The lead set adjacent to the supporting area is electrically connected to the semiconductor chip via at least one bonding wire. The molding compound encapsulates the semiconductor chip, the bonding wire and a portion of the lead. The downset anchor bar having a protrusion portion which is between the first paddle and the second paddle and is downset from the side rail.

A further aspect of the present invention is to provide a semiconductor packaging method to improve the consequent manufacturing processes so as to form a semiconductor package structure and to reduce the manufacturing cost. The semiconductor packaging method comprises several steps as following: First, a lead frame structure comprising a side rail, a first paddle, a second paddle, at least one lead, and a downset anchor bar is provided. Wherein the first paddle is connected to the side rail via at least one first tie bar, and the second paddle is connected to the side rail via at least one second tie bar; the first paddle and the second paddle separated from each other are used to define an area to support a chip; the lead set on the side rail expends toward to the chip supporting area; one end of the downset anchor bar is connected to the side rail, and the other end of the downset anchor bar has a protrusion portion downset between the first paddle and the second paddle. A semiconductor chip is then fixed on the supporting area defined by the first paddle and the second paddle. Subsequently, the semiconductor chip is electrically connected to the lead via at least one bonding wire. A molding compound is then used to encapsulate the semiconductor chip, the bonding wire, the downset anchor bar and a portion of the lead.

In accordance with the aforementioned embodiments, the characteristics of the present invention are to provide a lead frame structure having at least two separated paddles, wherein the at least two paddles can be combined to substitute the conventional panel-type chip carrier to support a semiconductor chip. In comparison with the conventional lead frame structure, applying two separated paddles to substitute the conventional panel-type chip carrier can save the materials in constructing the lead frame structure; and the packaging materials, such as adhesives used to fixed the semiconductor chip on the two separated paddles, can also be saved. Furthermore, since there exists gaps between the separated paddles, the flowing resistance of the molding compound against the lead frame structure can be reduced during the compound-encapsulating step, so as to enhance the fluidity and dispersion of the melted compound and to restrain the delaminating problems occur between the semiconductor chip and the carrier. In additional, the downset anchor bar actually connected to the side rail of the lead frame structure can provide steady supporting force against the compress of the flowing melted compound to preserve the at least two paddles from bended during the compound-encapsulating step. Accordingly the semiconductor chip packaging process can be widely improved and the yield of the semiconductor package structure can be increased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DETAILED DESCRIPTION OF THE PREFERRED EMBODIMENT

The foregoing aspects and many of the attendant advantages of this invention will become more readily appreciated and better understood by reference to the following semiconductor package structures serve as preferred embodiments.

Figure 1A:
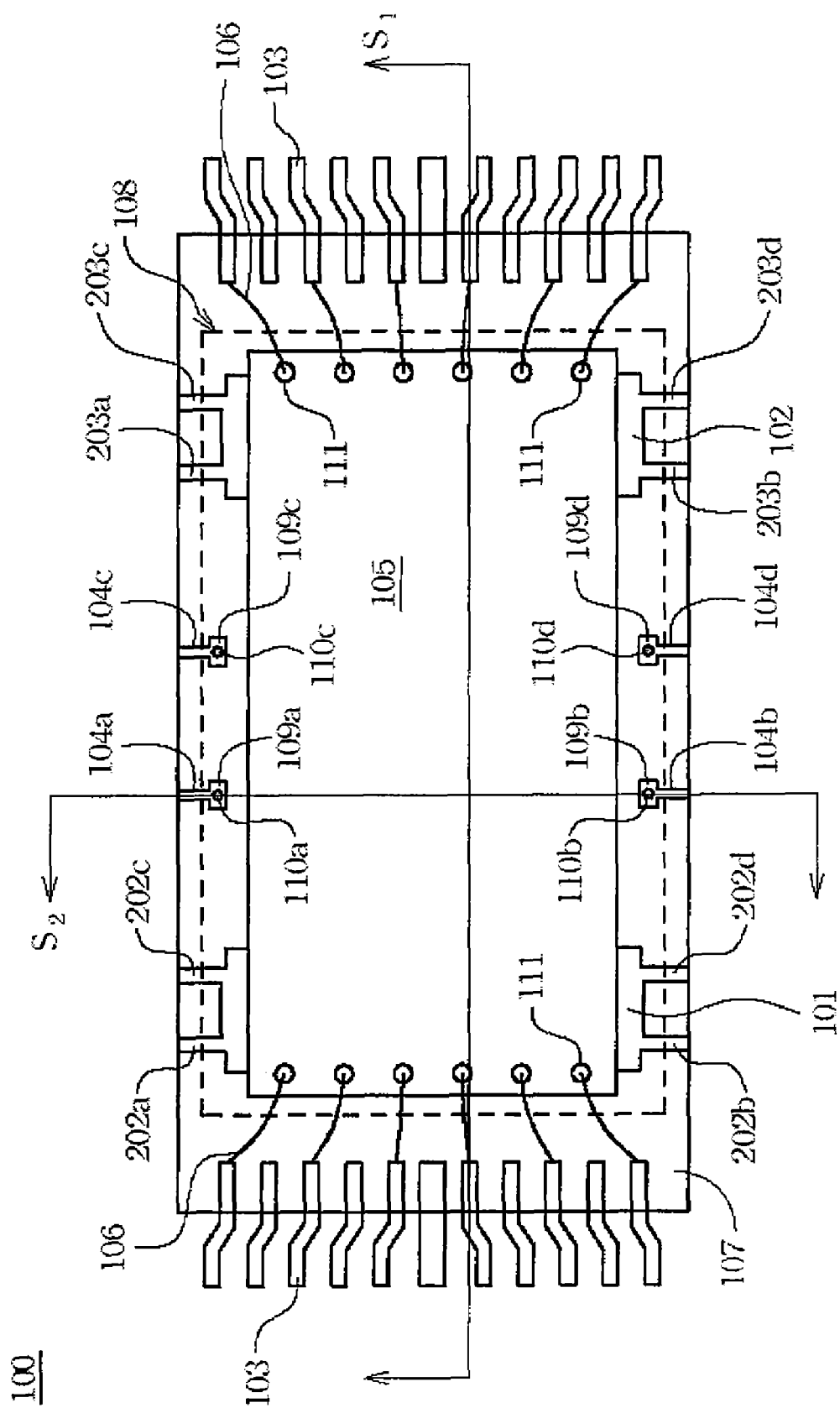
FIG. 1A illustrates a vertical view of a semiconductor package structure 100 in accordance with a preferred embodiment of the present invention.
Figure 1B:
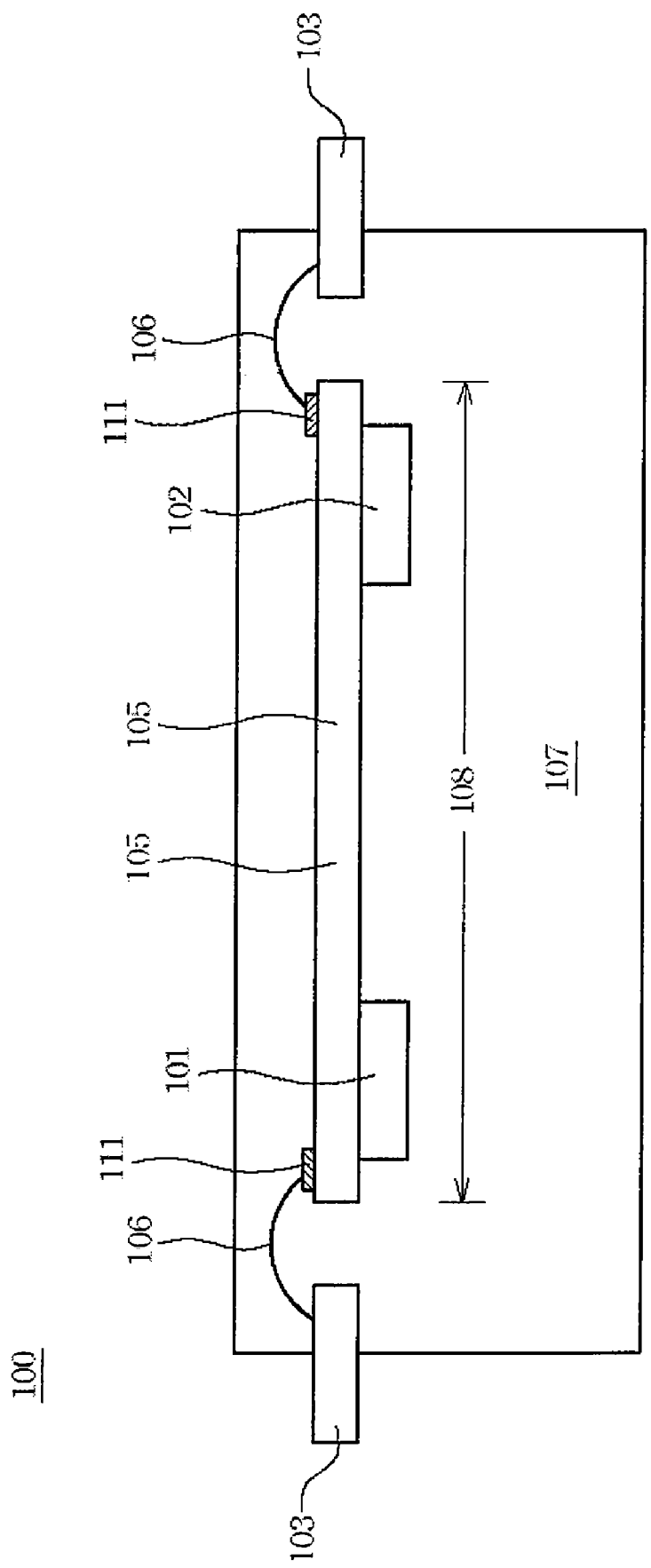
FIG. 1B illustrates a cross-section view of the semiconductor package structure 100 along the cross-section line S1 indicated on FIG. 1A.
Figure 1C:
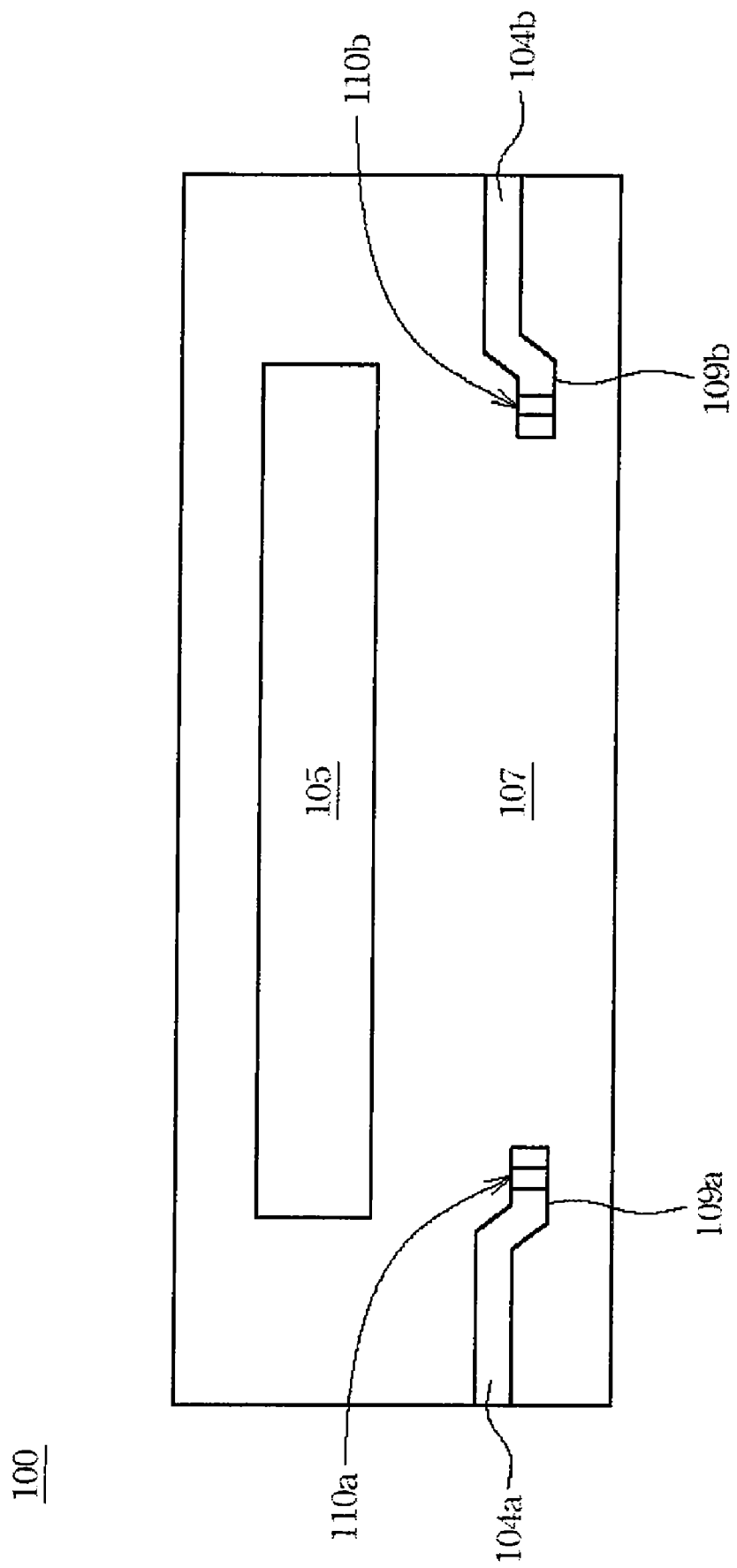
FIG. 1C illustrates a cross-section view of the semiconductor package structure 100 along the cross-section line S2 indicated on FIG. 1A.

FIG. 1A illustrates a vertical view of a semiconductor package structure 100 in accordance with a preferred embodiment of the present invention. FIG. 1B illustrates a cross-section view of the semiconductor package structure 100 along the cross-section line S1 indicated on FIG. 1A. FIG. 1C illustrates a cross-section of the semiconductor package structure 100 along the cross-section line S2 indicated on FIG. 1A. The semiconductor package structure 100 comprises a first paddle 101, a second paddle 102, a semiconductor chip 105, a plurality of leads 103, at least one downset anchor bar (such as the downset anchor bars 104a, 104b, 104c and 104d) a plurality of bonding wires 106 and a molding compound 107.

The first paddle 101 and the second paddle 102 are constructed by two separated metal sheets and are used to define an area 108 to support the semiconductor chip 105. An adhesive, such as silver past, is used to fix the semiconductor chip 105 on the supporting area 108. In some embodiments of the present invention, the semiconductor chip 105 can be a semiconductor die, a single chip package or a multi-chip module.

These leads 103 are set adjacent to the supporting area 108, and are electrically connected to the bumps 111 set on the semiconductor chip 105 via the bonding wires 106, wherein each of the bonding wire 106 is associated one of these leads 103 with one of the bumps 111. In the present embodiment (referring to FIG. 1B), the first paddle 101 and the second paddle 102 are downset from these leads 103 and the side rail. It means that the first paddle 101 and the second paddle 102 are formed on the level lower than the level of these leads 103 and the side rail. Otherwise, in some other embodiments of the present invention, the first paddle 101, the second paddle 102 and these leads 103 (and side rail) are formed on the same level.

The downset anchor bars 104a, 104b, 104c and 104d, each has a protrusion portion, are symmetrically between the first paddle 101 and the second paddle 102. For example the downset anchor bar 104a having a protrusion portion 109a and the downset anchor bar 104b having a protrusion portion 109b are symmetrically set between the first paddle 101 and the second paddle 102; and the downset anchor bar 104c having a protrusion portion 109c and downset anchor bar 104d having a protrusion portion 109d are symmetrically set between the first paddle 101 and the second paddle 102. In the present embodiment (referring to FIG. 1C), the protrusion portions 109a, 109b, 109c and 109d are downset from the first paddle 101 and the second paddle 102. Thus the first paddle 101 and the second paddle 102 both have a level higher than the protrusion portions 109a, 109b, 109c and 109d. Otherwise, in some other embodiments of the present invention, the first paddle 101, the second paddle 102 and the protrusion portions 109a, 109b, 109c and 109d are formed on the same level.

In the present embodiment, the protrusion portions 109a, 109b, 109c and 109d are shaped as a fluke, and each has a through hole. For example the protrusion portions 109a has a through hole 110a; the protrusion portions 109b has a through hole 110b; the protrusion portions 109c has a through hole 110c; and the protrusion portions 109d has a through hole 110d.

The compound 107 encapsulates the semiconductor chip 105, the bonding wires 106 and portions of these leads 103. The compound 107 further encapsulates the protrusion portions 109a, 109b, 109c and 109d, and the through holes 110a, 110b 110c and 110d are filled up with the compound 107.

Figure 2:
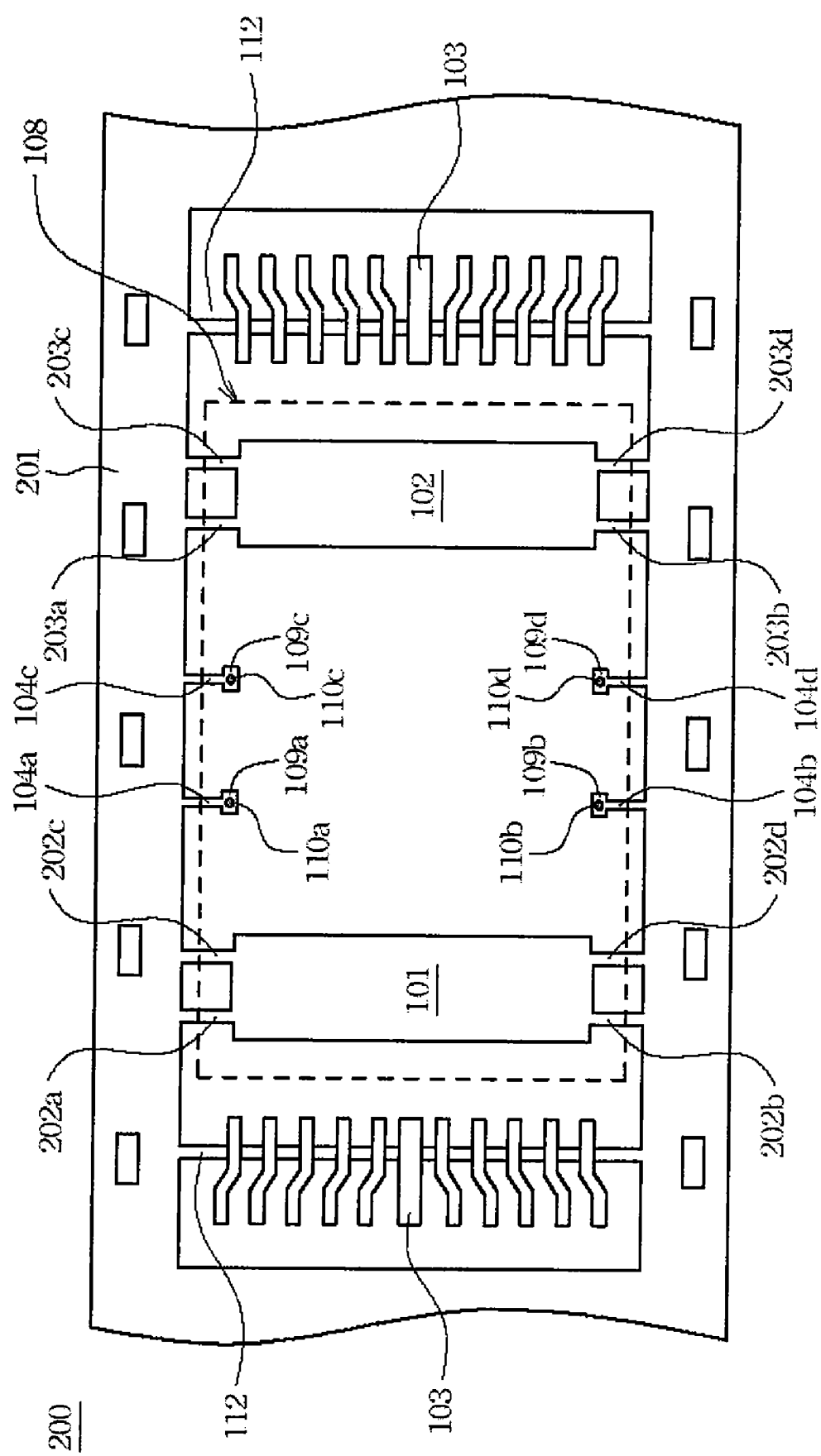
FIG. 2 illustrates a vertical view of a lead frame structure 200 used to manufacture the semiconductor package structure 100 shown in FIG. 1A.

The method for manufacturing the semiconductor package structure 100 comprises several steps as follows: First, a lead frame structure 200 is provided. FIG. 2 illustrates a vertical view of a lead frame structure 200 used to manufacture the semiconductor package structure 100 shown in FIG. 1A. Wherein the lead frame structure 200 comprises a side rail 201, a first paddle 101, a second paddle 102, a plurality of leads 103, and a plurality of downset anchor bars 104a, 104b, 104c and 104d.

The lead frame structure 200 is a framework constructed by at least one side rail 201 used to support the first paddle 101 and the second paddle 102. The first paddle 101 and the second paddle 102 are separated from each other used to define an area 108 to support a semiconductor chip 105. The first paddle 101 is connected to the side rail 201 via at least one first tie bar, and the second paddle 102 is connected to the side rail 201 via at least one-second tie bar.

In the present embodiment, the lead frame structure 200 is a rectangular framework constructed by two side rails 201 and two dame bars 112, wherein the two side rails 201 are perpendicular to the first paddle 101 and the second paddle 102; and the two dame bars 112 are subsidiary side rails parallel to the first paddle 101 and the second paddle 102. There are two pairs of first tie bar used to symmetrically connect the first paddle 101 with the two side rails 201, and there are two pairs of second tie bar used to symmetrically connect the second paddle 102 with the two side rails 201.

For example, one pair of the first tie bars 202a and 202c protrude from the right hand side rail 201, and another pair of the first tie bars 202b and 202d protrude from the left hand side rail 201; and these two pairs of the first tie bars 202a, 202b, 202c and 202d are symmetrically connected to the first paddle 101. Similarly, one pair of second tie bars 203a and 203c protrude from the right hand side rail 201, and another pair of the second tie bars 203b and 203d protrude from the left hand side rail 201; and these two pairs of the second tie bars 203a, 203b, 203c and 203d are symmetrically connected to the second paddle 102.

These leads 103 are respectively set on the two dame bars 112 and expend toward to the chip supporting area 108. In the present embodiment, the first paddle 101 and the second paddle 102 are downset from the side rail 201.

The downset anchor bar 104a, 104b, 104c and 104d are four shafts symmetrically protruding from the two side rails 201. Each of the downset anchor bars 104a, 104b, 104c and 104d has one end connected to the side rail 201, and has the other end with a protrusion portion (109a, 109b, 109c or 109d) shaped as a fluke which is downset between the first paddle 101 and the second paddle 102. For example, the downset anchor bars 104a with a protrusion portion 109a and the downset anchor bars 104b with a protrusion portion 109b protrude from the side rail 201 symmetrically and extend to the area beneath the chip supporting area 108 between the first paddle 101 and the second paddle 102; the downset anchor bars 104c with a protrusion portion 109c and the downset anchor bars 104d with a protrusion portion 109d protrude from the side rail 201 symmetrically and extend to the area beneath the chip supporting area 108 between the first paddle 101 and the second paddle 102, whereby each of the downset anchor bars 104a, 104b, 104c and 104d has a level lower than the level of the first paddle 101 and the second paddle 102. In the present embodiment, each of the protrusion portions 109a, 109b, 109c and 109d has a through hole, such as through holes 110a, 110b, 110c and 110d.

An adhesive, such as silver past, is then used to fix the semiconductor chip 105 onto the first paddle 101 and the second paddle 102 within the supporting area 108. Subsequently, bumps 111 set on the semiconductor chip 105 are respectively electrically connected to the leads 103 set adjacent to the supporting area 108 via at least one bonding wires 106. In the present embodiment, each of the bonding wire 106 is associated one of these leads 103 with one of the bumps 111.

After the semiconductor chip 105 is fixed, a molding compound 107 is poured to encapsulate the semiconductor chip 105, the bonding wires 106, the downset anchor bars 104a, 104b, 104c and 104d and the portions of these leads 103 where are clerically connected to the bumps 111. The compound 107 not only encapsulates the protrusion portions 109a, 109b, 109c and 109d, but also fills up the through holes 110a, 110b 110c and 110d.

Subsequently, a downstream process, such as a dejunk process, is conducted to remove the redundant compound glued in the gaps between two of the leads 103 by a series punch steps. The redundant leads and dame bar 112 are simultaneously trimmed, and the first tie bars 202a, 202b, 202c and 202d and the second tie bars 203a, 203b, 203c and 203d are also cut off during the punch steps, whereby the two side rails 201 are separated from the first paddle 101 and the second paddle 102. After the series punch steps the remained leads 103 can be bend into a predetermined shape, and a singulation process can be conducted to remove the side rails 201 and to form the semiconductor package structure 100 shown in FIG. 1A.

It must be appreciated that when the first tie bars 202a, 202b, 202c and 202d and the second tie bars 203a, 203b, 203c and 203d are cut off, there still remains the downset anchor bars 104a, 104b, 104c and 104d to connect the encapsulated semiconductor with the side rails 201, such that the semiconductor package structure 100 can be steady supported during the downstream process.

In accordance with the aforementioned embodiments, the characteristics of the present invention are to provide a lead frame structure having at least two separated paddles, wherein the at least two paddles can be combined to substitute the conventional panel-type chip carrier to support a semiconductor chip. In comparison with the conventional lead frame structure, applying two separated paddles to substitute the conventional panel-type chip carrier can save the materials in constructing the lead frame structure; and the packaging materials, such as adhesives used to fixed the semiconductor chip on the two separated paddles, can also be saved. Furthermore, since there exists gaps between the separated paddles, the flowing resistance of the melted compound against the lead frame structure can be reduced during the compound-encapsulating step, so as to enhance the fluidity and dispersion of the melted compound and to restrain the delaminating problems occur between the semiconductor chip and the carrier. In additional, the downset anchor bar actually connected to the side rail of the lead frame structure can provide steady supporting force against the compress of the flowing melted compound to preserve the at least two paddles from bended during the compound-encapsulating step. Accordingly the semiconductor chip packaging process can be widely improved and the yield of the semiconductor package structure can be increased.

As is understood by a person skilled in the art, the foregoing preferred embodiments of the present invention are illustrative, rather than limiting, of the present invention and are intended to cover various modifications and similar arrangements included within the spirit and scope of the appended claims, the scope of which should be accorded the broadest interpretation so as to surround all such modifications and similar structures.

What is claimed is:

1. A lead frame structure comprising:
   a side rail;
   a first paddle, connected to the side rail via at least one first tie bar;
   a second paddle, connected to the side rail via at least one second tie bar, wherein the first paddle and the second paddle separated from each other are used to define an area to support a chip;
   at least one lead, set on the side rail extends toward the chip supporting area; and
   a downset anchor bar, separated from the first paddle and the second paddle, wherein one end of the downset anchor bar is connected to the side rail, and the other end of the downset anchor bar has a protrusion portion which is disposed between the first paddle and the second paddle and is downset from the side rail.

2. The lead frame structure in accordance with claim 1, wherein the first paddle and the second paddle are downset from the side rail.

3. The lead frame structure in accordance with claim 2, wherein the protrusion portion has a different level from the first paddle and the second paddle.

4. The lead frame structure in accordance with claim 1, wherein the protrusion portion has a through hole.

5. The lead frame structure in accordance with claim 2, wherein the protrusion portion, the first paddle and the second paddle are at the same level.

6. The lead frame structure in accordance with claim 1, wherein the first paddle and the second paddle are constructed by two separated metal sheets.

7. A semiconductor package structure, comprising:
a side rail;
a first paddle, connected to the side rail via at least one first tie bar;
a second paddle, connected to the side rail via at least one second tie bar, wherein the first paddle and the second paddle separated from each other are used to define an area to support a chip;
at least one lead, set on the side rail extends toward the chip supporting area;
a downset anchor bar, separated from the first paddle and the second paddle, wherein one end of the downset anchor bar is connected to the side rail, and the other end of the downset anchor bar has a protrusion portion which is disposed between the first paddle and the second paddle and is downset from the side rail;
a semiconductor chip, fixed on the area;
at least one bonding wire, electrically connecting the semiconductor chip with the lead; and
a compound, encapsulating the semiconductor chip, the bonding wire, the downset anchor bar and a portion of the lead.

8. The semiconductor package structure in accordance with claim 7, wherein the first paddle and the second paddle are downset from the side rail.

9. The semiconductor package structure in accordance with claim 8, wherein the protrusion portion has a different level from the first paddle and the second paddle.

10. The semiconductor package structure in accordance with claim 7, wherein the protrusion portion has a through hole.

11. The semiconductor package structure in accordance with claim 8, wherein the protrusion portion, the first paddle and the second paddle are at the same level.

12. The semiconductor package structure in accordance with claim 7, wherein the first paddle and the second paddle are constructed by two separated metal sheets.

13. The semiconductor package structure in accordance with claim 7, wherein the semiconductor chip is selected from the group in consisting of a semiconductor die, a single chip package and a multi-chip module.

14. A semiconductor packaging method, comprising:
providing a lead frame structure comprising:
 a side rail;
 a first paddle, connected to the side rail via at least one first tie bar;
 a second paddle, connected to the side rail via at least one second tie bar, wherein the first paddle and the second paddle separated from each other are used to define an area to support a chip;
 at least one lead, set on the side rail extends toward the chip supporting area; and
 a downset anchor bar, separated from the first paddle and the second paddle, wherein one end of the downset anchor bar is connected to the side rail, and the other end of the downset anchor bar has a protrusion portion which is disposed between the first paddle and the second paddle and is downset from the side rail;
fixing a semiconductor chip on the area;
using at least one bonding wire to electrically connect the semiconductor chip with the lead; and
using a compound to encapsulate the semiconductor chip, the bonding wire, the downset anchor bar and a portion of the lead.

* * * * *